(12) United States Patent
Hagiwara

(10) Patent No.: US 6,236,226 B1
(45) Date of Patent: May 22, 2001

(54) TEST METHOD AND SYSTEM FOR UNINTERRUPTIBLE POWER SUPPLY

(75) Inventor: Yoshihiro Hagiwara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/186,016

(22) Filed: Nov. 4, 1998

(30) Foreign Application Priority Data

Nov. 5, 1997 (JP) .................................. 9-302292

(51) Int. Cl.$^7$ .................................................. G01R 31/36
(52) U.S. Cl. .................................................. 324/771
(58) Field of Search .................... 324/771, 430, 324/429, 426; 320/106, 107, 112, 113, 131, 132, 118, 128, 135; 307/64

(56) References Cited

U.S. PATENT DOCUMENTS 5,886,503 * 3/1999 McAndrews et al. ............ 320/121
5,977,750 * 11/1999 Ng et al. ............................ 320/132

FOREIGN PATENT DOCUMENTS 4-147076  5/1992  (JP) .

* cited by examiner

Primary Examiner—Safet Metjahic
Assistant Examiner—J. Kerveros
(74) Attorney, Agent, or Firm—Scully, Scott, Murphy & Presser

(57) ABSTRACT

In a system composed of an uninterruptible power supply UPS) and a computer that is supplied with power from the UPS, the UPS includes a test switch that is turned off by the control of the computer until a test time period has elapsed. The computer includes a test flag memory that holds its data when the UPS does not supply power to the computer. The computer uses the test flag memory to determine whether the UPS is under abnormal conditions.

16 Claims, 4 Drawing Sheets

TEST METHOD AND SYSTEM FOR UNINTERRUPTIBLE POWER SUPPLY

BACKGROUND OF THE INVENTION

1. Field of the invention

The present invention generally relates to an uninterruptible power supply system composed of an uninterruptible power supply and equipment to be supplied with power such as a computer system, and in particular to test method and system for the uninterruptible power supply.

2. Description of the Related Art

An uninterruptible power supply (UPS) unit has been mandatory equipment if a blackout will cause the loss of crucial data. A UPS unit is equipped with a battery and a sensor for sensing a loss of power. When the sensor detects a loss of power, it immediately switches over to the battery so that continuous power is supplied to a computer system and the user has time to save crucial data and shut off the computer. The battery is usually charged while the computer is switched on.

There has been proposed a power supply system equipped with a backup-battery check circuit in Japanese Patent Unexamined Publication No. 4-147076. More specifically, when powered on, the backup-battery check circuit checks the output voltage of the backup battery in such a state that a battery charger is disconnected from the backup battery. Therefore, a precise and reliable voltage check can be achieved. After the check has been completed, the battery charger starts charging the backup battery and supplying power to a system that is to be backed up.

According to the conventional system, however, since the backup-battery check operation is performed only at power-on, failure of backup battery cannot be checked without an operator.

Further, the backup-battery check circuit is connected to a backup power supply line at a predetermined position and checks whether failure of backup battery occurs. Since the backup-battery check circuit is also connected to the system that is to be backed up, it can check only a part of the backup power supply line. In other words, the backup-battery check circuit cannot check the overall backup power supply line.

SUMMARY OF THE INVENTION

An object of the present invention is to provide a test method and system which can provide self-test function to automatically detect failure of a backup power supply Another object of the present invention is to provide a test method and system which can test the overall backup power supply line from a backup power supply to equipment to be supplied with power.

According to the present invention, an uninterruptible power supply includes a backup power supply for supplying continuous power to equipment when an external power is interrupted. Further the uninterruptible power supply includes a test switch connected between the backup power supply and the external power source and a switch controller for turning the test switch off in response to a test start signal and turning it on after a lapse of a first predetermined time period.

The equipment includes a memory for storing a test flag that is maintained when the uninterruptible power supply does not supply the power to the equipment. The equipment is further composed of a test controller performing test control.

More specifically, the test start signal is output to the switch controller when the test flag is set to a first state. If the power is normally supplied from the uninterruptible power supply during a second predetermined time period shorter than the first predetermined time period, then the test flag is reset to a second state. When the test flag is in the first state with the power supplied from the uninterruptible power supply after a lapse of the first predetermined time period, the test controller determines that the backup power supply is in abnormal conditions.

DETAILED DESCRIPTION OF THE PREFERRED EMBODIMENT

Figure 1:
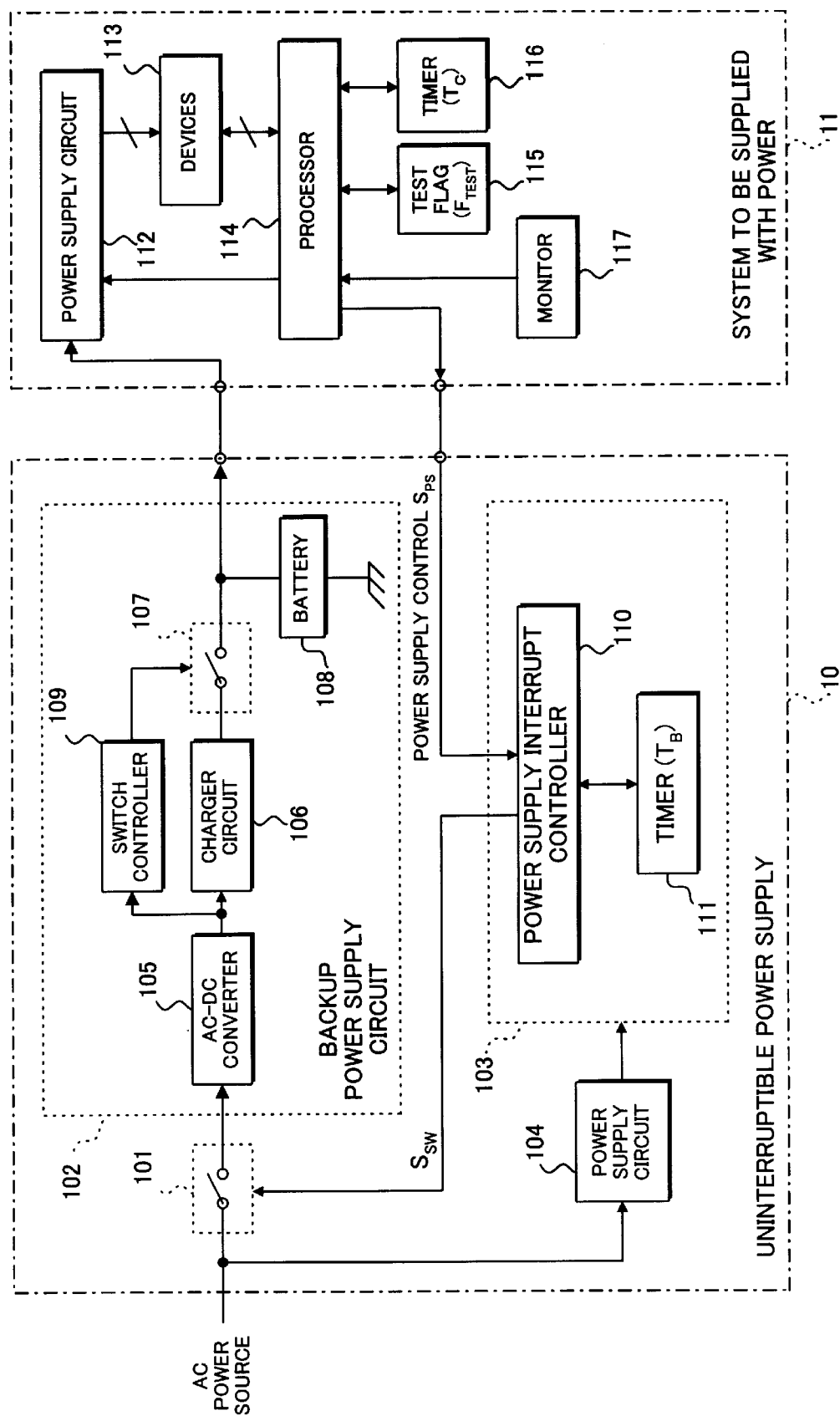
FIG. 1 is a block diagram showing an uninterruptible power supply system employing an embodiment of a test system according to the present invention.

Referring to FIG. 1, an uninterruptible power supply system (UPS) is composed of a UPS unit 10 and a system 11 that is supplied with power by the UPS unit 10 connected to alternating current (AC) power source (usually an outlet receptacle).

The UPS unit 10 is provided with a test switch 101 that connects a backup power supply circuit 102 to the AC power source. As will be described, the test switch 101 is controlled by a controller 103 such that it is normally closed and opened during a predetermined test period. The controller 103 is powered by a power supply circuit 104 that inputs AC power from the AC power source. Alternatively, the controller 103 may be powered by a battery (not shown) incorporated in the UPS unit 10.

The backup power supply circuit 102 is a backup power supply that performs a function of switching over to a secondary battery 108 when the AC power is interrupted. Here, a typical circuit construction will be described. The backup power supply circuit 102 is composed of an AC-DC converter 105 that is connected to the switch 101 and converts alternating current (AC) into direct current (DC).. The DC output of the AC-DC converter 105 is supplied to a charger circuit 106. The charger circuit 106 outputs DC power to the secondary battery 108 and the system 11 through a switch 107. The switch 107 is controlled by a switch controller 109 that detects a loss of power from the DC output of the AC-to-DC converter 105. When normally operated, the switch 107 is closed and the DC power is supplied to both the system 11 and the battery 108 for charging. When a loss of power is detected due to a blackout or the like, the switch 107 is opened and the power of the battery 108 is supplied to the system 11, resulting in continuous power supplied to the system 11.

The controller 103 is composed of a power-supply interrupt controller 110 and a timer 111. The timer 111 is set for a predetermined time period $T_B$ and operates under the control of the power supply interrupt controller 110. More specifically, when receiving a power-supply control signal $S_{PS}$ indicating test start from the system 11, the power supply interrupt controller 110 starts the timer 111 and makes the test switch 101 open. Since the AC power is interrupted, the backup power supply circuit 102 normally switches over to the battery 108 and provides continuous DC power to the system 11. However, if the backup power supply circuit 102 is operating under abnormal conditions, the DC power is not supplied to the system 11. After a lapse of the predetermined time period $T_B$, that is, a timeout occurs at the timer 111, the power supply interrupt controller 110 makes the test switch 101 closed and the backup power supply circuit 102 supplies the DC power to the system 11 again.

The system 11 to be supplied with power is usually a computer system. It is provided with a power supply circuit 112 that inputs the DC power from the UPS unit 10 and supplies necessary power to devices 113 including a backup memory and a calendar clock. The power supply circuit 112 also supplies power to a processor 114, which automatically performs the test of the UPS unit 10 by running a UPS test program stored in a read-only memory (not shown).

The processor 114 has a test flag memory 115 and a timer 116 connected thereto. The test flag memory 115 may be a nonvolatile memory that does not lose flag data when power is removed from it. Alternatively, the test flag memory 115 may be backed up to keep flag data by a battery incorporated in the system 11. The timer 116 is set for a predetermined time period $T_C$ and operates under the control of the processor 114. The predetermined time period $T_C$ is sufficiently shorter than the predetermined time period $T_B$ of the timer 111 of the UPS unit 10. Therefore, a timeout occurs at the timer 116 earlier than at the timer 111.

More specifically, after the processor 114 has set itself to a power-down-ready state, the processor 114 outputs the power-supply control signal $S_{PS}$ indicating a test start to the UPS unit 10. At the same time, the processor stores an initial set value (here, logical high: 1) as test flag data $F_{TEST}$ onto the test flag memory 115 and starts the timer 116 counting. The timer 116 continues to count so long as the backup power is being supplied from the UPS unit 10. When a timeout occurs at the timer 116 earlier than at the timer 111, it means that the backup power supply circuit 102 has normally operated. Therefore, the processor 114 resets the test flag data $F_{TEST}$ stored in the test flag memory 115 to a logical low: 0 and then informs an operator by displaying, for example, "normal" on a monitor 117 that the UPS unit 10 normally operates.

In contrast, when the backup power is not supplied to the system 11 during the test period, the timer 116 cannot count. Since the test flag memory 115 is nonvolatile or backed up, the test flag data $F_{TEST}$ stored in the test flag memory 115 is kept at the initial set value (1). When a timeout occurs at the timer 111 of the UPS unit 10, the test switch 101 is closed and the backup power supply circuit 102 restarts supplying the DC power to the system 11.

After the DC power generated by the AC power has been supplied to the system 11, the processor 114 can determine whether the UPS unit 10 is operating normally by checking the test flag $F_{TEST}$ stored in the test flag memory 115. In the case where the backup power supply circuit 102 does not operate, the test flag $F_{TEST}$ is identical to the initial set value. Therefore, it is determined that the backup power supply circuit 102 is under abnormal conditions and the operator is informed by display of the word "failure" on the monitor 117.

Figure 2:
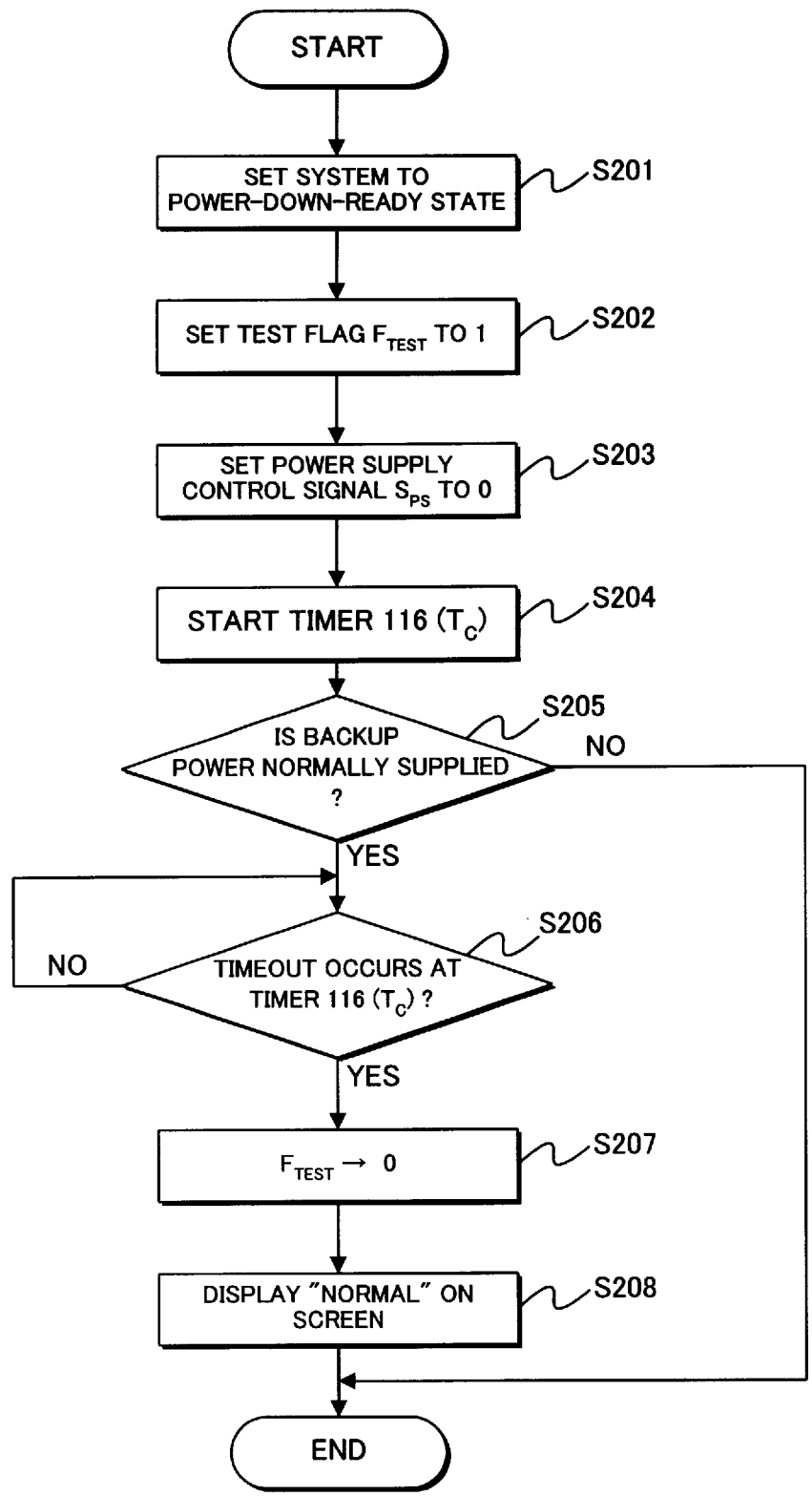
FIG. 2 is a flowchart showing operation of the system to be supplied with power in an embodiment of a test method according to the present invention.

Referring to FIG. 2, there is shown steps of the operation of the system 11 according to the embodiment. When the processor 114 has set itself to a power-down-ready state (step S201), the processor 114 sets the test flag $F_{TEST}$ of the test flag memory 115 to 1 (step S202). Thereafter, the processor 114 sets the power-supply control signal $S_{PS}$ to 0 and then outputs it to the UPS unit 10 (step S203). At the same time, the processor starts the timer 116 set for $T_C$ counting. In this manner, the test operation is started.

The processor 114 of the system 11 monitors the power detection signal input from the power supply circuit 112 and determines whether the backup power is normally supplied from the UPS unit 10 (step S205). The timer 116 continues to count so long as the backup power is being supplied from the UPS unit 10 (YES in step S205 and NO in step S206). When a timeout occurs at the timer 116 (YES in step S206), the processor 114 resets the test flag $F_{TEST}$ stored in the test flag memory 115 to 0 (step S207) and then informs an operator by displaying the word "normal" on the monitor 117 that the UPS unit 10 is operating normally (step S208)

Figure 3:
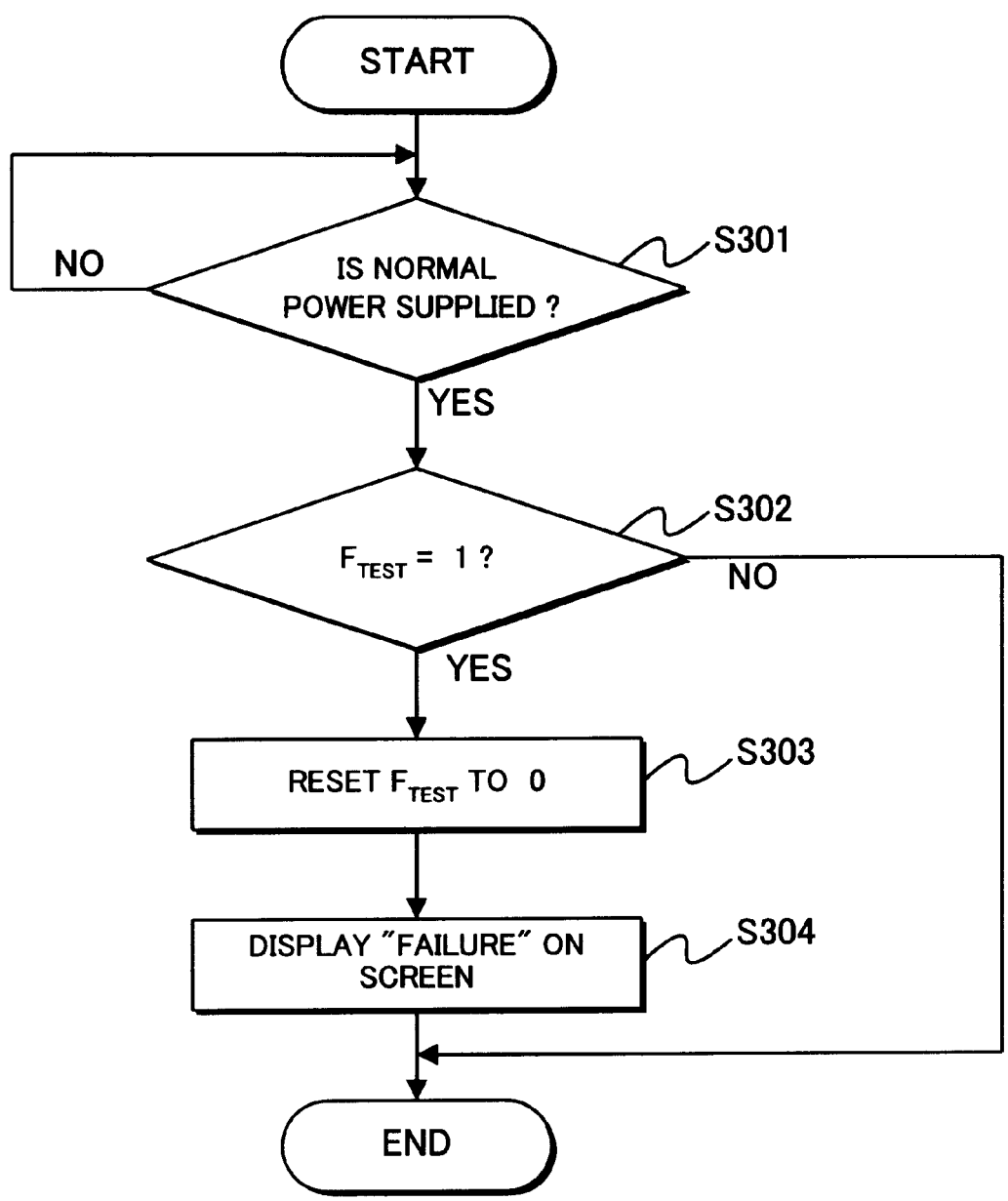
FIG. 3 is a flowchart showing a determination operation of the system to be supplied with power in the embodiment of the test method.

Referring to FIG. 3, there is shown a determination routine running on the processor 114 of the system 11. After a lapse of the predetermined time period $T_B$ of the timer 111, the processor 114 determines that the DC power is supplied to the system 11 (YES in step S301) and further determines whether the test flag $F_{TEST}$ stored in the test flag memory 115 is 1 (step S302).

In the case where the backup power supply circuit 102 has been operating normally, the test flag $F_{TEST}$ is reset to 0 in the step S207 of FIG. 2. However, in the case where the backup power supply circuit 102 does not operate due to some reason, the test flag $F_{TEST}$ is identical to the initial set value, that is, 1. Therefore, if $F_{TEST}$=1 (YES in step S302), it is determined that the latest power down is caused by abnormal conditions of the backup power supply circuit 102. In this case, the processor 114 resets the test flag $F_{TEST}$ to 0 and then displays "failure" on the monitor 117 to inform the operator of abnormal operation of the UPS unit 10 (step S304).

Figure 4:
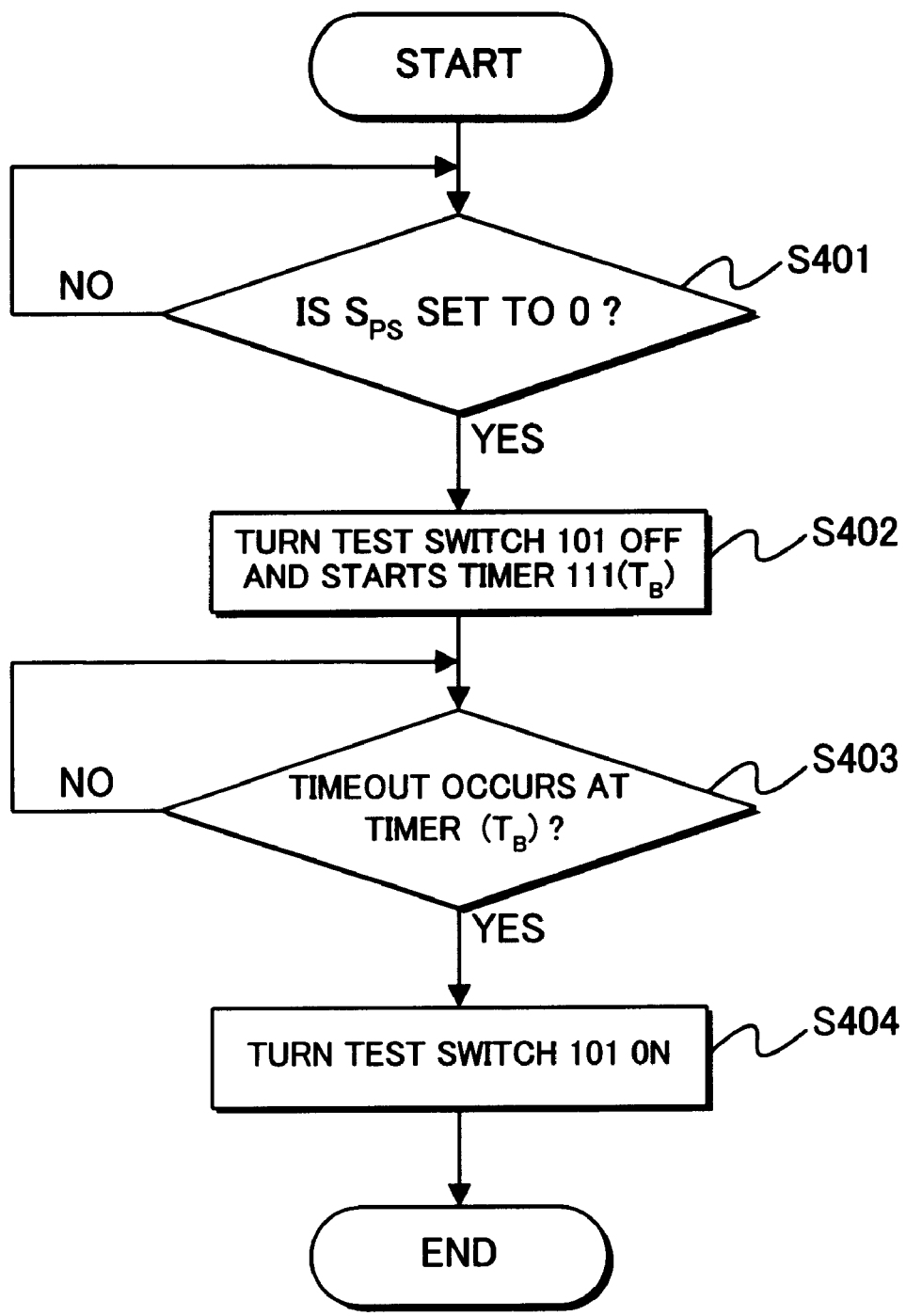
FIG. 4 is a flowchart showing operation of the UPS unit in the embodiment of the test method.

Referring to FIG. 4, there is shown the operation of the power supply interrupt controller 110 of the UPS unit 10. When receiving the power-supply control signal $S_{PS}$ indicating test start from the system 11 (YES in step S401), the power supply interrupt controller 110 turns the test switch 101 off and starts the timer 111 counting (step S402).

Since the predetermined time period $T_B$ of the timer 111 is sufficiently longer than the predetermined time period $T_C$ of the timer 116, a timeout occurs at the timer 111 later than at the timer 116. When a timeout occurs at the timer 111 of the UPS unit 10 (YES in step S403), the power supply interrupt controller 110 closes the test switch 101 (step S404). If the backup power is not normally supplied from the UPS unit 10, the backup power supply circuit 102 restarts supplying the DC power to the system 11 when the test switch 101 is closed.

As described above, the UPS unit 10 is provided with the test switch 101 that is turned off by the control of the system 11 until the test time period (here, $T_B$ of the timer 111) has elapsed. Further, the system 11 is provided with the test flag memory 115 which is used to determine whether the UPS unit 10 is operating under abnormal conditions. Therefore, the test of the UPS unit 10 can be automatically performed without an operator.

Further, in a state that the test switch 101 is turned off, the system 11 checks whether the DC power is normally supplied from the UPS unit 10 and the system 11 operates normally. Therefore, the overall backup power supply route from the backup power supply circuit 102 of the UPS unit 10 to the power supply circuit 112 of the system 11 itself can be checked.

What is claimed is:

1. A system for testing an uninterruptible power supply that inputs external power from an external power source and supplies power to equipment that is electrically connected to the uninterruptible power supply, wherein the uninterruptible power supply comprises:

a backup power supply for supplying continuous power to the equipment when the external power is interrupted;

a test switch connected between the backup power supply and the external power source; and a switch controller for, during a test of the uninterruptible power supply, opening the test switch in response to a test start signal and closing the test switch after a lapse of a first predetermined time period of the switch controller, and wherein the equipment comprises:

a memory for storing a test flag that is maintained in memory when the uninterruptible power supply does not supply power to the equipment during the test; and a test controller for performing test control such that the test start signal is output to the switch controller when the test flag is set to a first state and, if power is normally supplied from the uninterruptible power supply during a second predetermined time period of the test controller shorter than the first predetermined time period of the switch controller, then the test flag is reset to a second state, and further, the test controller determining that the backup power supply is in an abnormal condition when the test flag is in the first state with power supplied from the uninterruptible power supply after a lapse of the first predetermined time period of the switch controller and determining that the backup power supply is in a normal condition when the test flag is reset to the second state after a lapse of the second predetermined time period of the test controller.

2. The system according to claim 1, wherein the equipment further comprises a monitor, wherein the test controller displays information on the monitor indicating a failure occurring in the uninterruptible power supply when the test controller determines that the backup power supply is in an abnormal condition.

3. The system according to claim 2, wherein the test controller controls the monitor to display information indicating a normal condition of the uninterruptible power supply when the test flag is reset to the second state after a lapse of the second predetermined time period.

4. The system according to claim 1, wherein the test flag memory is a nonvolatile memory.

5. The system according to claim 1, wherein the memory is backed up by a battery incorporated in the equipment.

6. The system according to claim 1, wherein the equipment further comprises:

a power supply circuit for inputting power from the uninterruptible power supply and supplying power to necessary devices of the equipment.

7. The system according to claim 6, wherein the equipment is a computer having a program-controlled processor therein, and wherein the test controller is implemented with a test control program running on the program-controlled processor.

8. An apparatus which is electronically connected to an uninterruptible power supply that inputs external power from an external power source and supplies power to the apparatus, the uninterruptible power supply including: a backup power supply for supplying continuous power to the apparatus when the external power is interrupted; a test switch connected between the backup power supply and the external power source; and a switch controller for, during a test of the uninterruptible power supply, opening the test switch in response to a test start signal and closing the test switch after a lapse of a first predetermined time period of the switch controller, the apparatus comprising:

a display for displaying necessary information;

a memory for storing a test flag that is maintained in memory when the uninterruptible power supply does not supply power to the equipment during the test;

a timer for measuring a second predetermined time period shorter than the first predetermined time period; and a test controller for performing test control such that the test start signal is output to the switch controller and the timer is started when the test flag is set to a first state and, if power is supplied normally from the uninterruptible power supply until a timeout occurs at the timer, then the test flag is rest to a second state, and further, the test controller determining that the backup power supply is in an abnormal condition when the test flag is in the first state with power supplied from the uninterruptible power supply after a lapse of the first predetermined time period of the switch controller and determining that the backup power supply is in a normal condition when the test flag is reset to the second state after a lapse of the second predetermined time period of the test controller.

9. The apparatus according to claim 8, wherein the test controller displays information on the display indicating a failure occurring in the uninterruptible power supply when the test controller determines that the backup power supply is in an abnormal condition.

10. The apparatus according to claim 9, wherein the test controller controls the monitor to display information indicating a normal condition of the uninterruptible power supply when the test flag is reset to the second state after a lapse of the second predetermined time period.

11. The apparatus according to claim 8, further comprising a power supply circuit for inputting power from the uninterruptible power supply and supplying power to necessary devices thereof.

12. The apparatus according to claim 11, wherein the test controller is implemented with a test control program running on a program-controlled processor.

13. A method for testing an uninterruptible power supply that inputs external power from an external power source and supplies power to equipment that is electrically connected to the uninterruptible power supply, the uninterruptible power supply having a backup power supply for supplying continuous power to the equipment when the external power is interrupted, a test switch connected between the backup power supply and the external power source, the method comprising the steps of:

at the uninterruptible power supply, a) during a test of the uninterruptible power supply, opening the test switch in response to a test start signal and closing the test switch after a lapse of a first predetermined time period of a switch controller; at the equipment, b) storing a test flag that is maintained in memory when the uninterruptible power supply does not supply power to the equipment during the test;

c) setting the test flag to a first state when outputting the test start signal to the switch controller;

d) resetting the test flag to a second state when power is supplied normally from the uninterruptible power supply during a second predetermined time period of a test controller which is shorter than the first predetermined time period of the switch controller; and e) determining that the backup power supply is in an abnormal condition when the test flag is in the first state with power supplied from the uninterruptible power supply during the test after a lapse of the first predetermined time period of the switch controller and determining that the backup power supply is in a normal condition when the test flag is reset to the second state after a lapse of the second predetermined time period of the test controller.

14. The method according to claim 13, further comprising a step of displaying information on a screen indicating a failure occurring in the uninterruptible power supply when the test controller determines that the backup power supply is in an abnormal condition.

15. The method according to claim 13, further comprising a step of displaying information on a monitor indicating a normal condition of the uninterruptible power supply when the test flag is reset to the second state after a lapse of the second predetermined time period.

16. A storage medium for storing a test control program that is executed by a computer which is supplied with power by an uninterruptible power supply comprising: a backup power supply for supplying continuous power to equipment when the external power is interrupted; a test switch connected between the backup power supply and the external power source; and a switch controller for, during a test of the uninterruptible power supply, opening the test switch in response to a test start signal and closing the test switch after a lapse of a first predetermined time period of the switch controller, the test control program comprising the steps of:

a) storing a test flag that is maintained in memory when the uninterruptible power supply does not supply power to the equipment during the test;

b) setting the test flag to a first state when outputting the test start signal to the switch controller;

c) resetting the test flag to a second state when power is supplied normally from the uninterruptible power supply during a second predetermined time period of a test controller which is shorter than the first predetermined time period of the switch controller; and d) determining that the backup power supply is in an abnormal condition when the test flag is in the first state with power supplied from the uninterruptible power supply during the test after a lapse of the first predetermined time period of the switch controller and determining that the backup power supply is in a normal condition when the test flag is reset to the second state after a lapse of the second predetermined time period of the test controller.

* * * * *